(12) United States Patent
Imura

(10) Patent No.: US 12,262,480 B2
(45) Date of Patent: Mar. 25, 2025

(54) COATING DEVICE AND COMPONENT MOUNTING MACHINE

(71) Applicant: FUJI CORPORATION, Chiryu (JP)

(72) Inventor: Jinya Imura, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 74 days.

(21) Appl. No.: 18/004,235

(22) PCT Filed: Jul. 17, 2020

(86) PCT No.: PCT/JP2020/027832
§ 371 (c)(1),
(2) Date: Jan. 4, 2023

(87) PCT Pub. No.: WO2022/014038
PCT Pub. Date: Jan. 20, 2022

(65) Prior Publication Data
US 2023/0247772 A1 Aug. 3, 2023

(51) Int. Cl.
*B23K 3/00* (2006.01)
*B23K 1/00* (2006.01)
(Continued)

(52) U.S. Cl.
CPC ............ *H05K 3/34* (2013.01); *B23K 1/0016* (2013.01); *B23K 3/0669* (2013.01); *B23K 3/082* (2013.01);
(Continued)

(58) Field of Classification Search
CPC ............... H05K 3/34; H05K 13/0404; H05K 2203/044; H05K 3/1275; H05K 3/3485;
(Continued)

(56) References Cited

U.S. PATENT DOCUMENTS 4,518,114 A * 5/1985 Walsh .................. B23K 3/0669
228/180.1
4,799,616 A * 1/1989 Simpson .................. B23K 1/08
228/180.1
(Continued)

FOREIGN PATENT DOCUMENTS

CN 1652316 A * 8/2005 ....... H01L 23/49816
CN 106332468 A * 1/2017
(Continued)

OTHER PUBLICATIONS

International Search Report issued Sep. 24, 2020 in PCT/JP2020/027832 filed on Jul. 17, 2020, citing documents 15-16 therein, 2 pages.

*Primary Examiner* — Kiley S Stoner
(74) *Attorney, Agent, or Firm* — Oblon, McClelland, Maier & Neustadt, L.L.P.

(57) ABSTRACT

A coating device includes a container, a driving device, and a control section. The container accommodates a liquid coating agent to be applied to multiple mounting portions of a board on which a component is to be mounted. The driving device horizontally moves and lifts and lowers a pin member between the container and the positioned board. The control section drives and controls the driving device to dip the pin member in the coating agent to apply the coating agent to each of the multiple mounting portions using the coating agent held by a distal end portion of the pin member.

14 Claims, 4 Drawing Sheets

(51) Int. Cl.
  *B23K 3/06* (2006.01)
  *B23K 3/08* (2006.01)
  *H05K 3/34* (2006.01)
  *H05K 13/04* (2006.01)
  *B23K 101/42* (2006.01)
(52) U.S. Cl.
  CPC ...... *H05K 13/0404* (2013.01); *B23K 2101/42* (2018.08); *H05K 2203/044* (2013.01)
(58) Field of Classification Search
  CPC .............. H05K 13/0469; B23K 1/0016; B23K 2101/42; B23K 3/0646–0676; B23K 3/082
  USPC ............................ 228/36, 40, 102–103, 8–12
  See application file for complete search history.

(56) References Cited

U.S. PATENT DOCUMENTS

| | | | | |
|---|---|---|---|---|
| 4,869,418 A | * | 9/1989 | Simpson | B23K 1/08 228/40 |
| 5,686,226 A | * | 11/1997 | Groman | H05K 13/0469 430/327 |
| 5,753,299 A | * | 5/1998 | Garcia | H05K 3/403 427/76 |
| 5,834,062 A | * | 11/1998 | Johnson | B05C 11/1034 427/256 |
| 6,257,480 B1 | * | 7/2001 | Furumoto | B23K 1/085 228/19 |
| 11,032,959 B2 | * | 6/2021 | Minoshima | H05K 13/04 |
| 2014/0126956 A1 | * | 5/2014 | Yokogawa | B23K 1/203 228/245 |
| 2014/0242753 A1 | * | 8/2014 | Yeo | H01L 24/75 228/33 |
| 2015/0060529 A1 | * | 3/2015 | Oka | B23K 3/0623 228/248.1 |
| 2019/0221456 A1 | * | 7/2019 | Amir | H01L 21/67132 |
| 2019/0254174 A1 | * | 8/2019 | Tanaka | H05K 13/0409 |

FOREIGN PATENT DOCUMENTS

| | | | | |
|---|---|---|---|---|
| CN | 104206033 B | * | 12/2017 | ........... B23K 1/0016 |
| CN | 208027905 U | * | 10/2018 | |
| DE | 19807279 A1 | * | 9/1999 | ......... H05K 13/0465 |
| DE | 102011077242 A1 | * | 12/2012 | ............... B23K 1/08 |
| EP | 0249168 A2 | | 12/1987 | |
| JP | 61007063 A | * | 1/1986 | ........... B23K 3/0676 |
| JP | 11-354914 A | | 12/1999 | |
| JP | 2010-177310 A | | 8/2010 | |
| TW | 201414557 A | * | 4/2014 | ........... B23K 1/0016 |
| WO | WO-2006112791 A1 | * | 10/2006 | ........... B23K 1/203 |
| WO | WO-2013153616 A1 | * | 10/2013 | ........... B23K 1/0016 |
| WO | WO-2014068691 A1 | * | 5/2014 | ......... B41F 15/0881 |
| WO | WO 2018/163331 A1 | | 9/2018 | |

\* cited by examiner

Fig. 5B
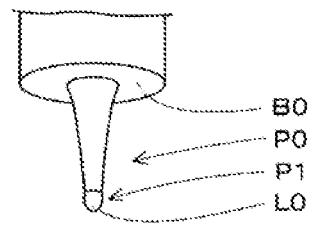
Fig. 5C
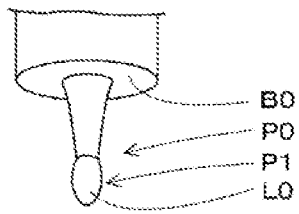
Fig. 6
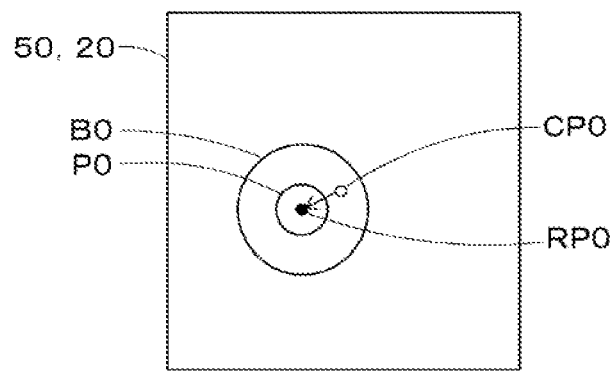
Fig. 7

COATING DEVICE AND COMPONENT MOUNTING MACHINE

TECHNICAL FIELD

The present specification discloses a technique related to a coating device and a component mounting machine.

BACKGROUND ART

An electronic component mounting method described in Patent Literature 1 includes a first step and a second step. In the first step, a transfer machine including a nozzle and a moving mechanism are driven to immerse the nozzle in cream solder in a cream solder bath, and thus, an appropriate amount of cream solder is adhered to a distal end portion of the nozzle. In the second step, the transfer machine is driven to cause the nozzle to into contact with a connecting portion of an electronic component mounting surface of a printed circuit board with a terminal of an IC, and thus, the cream solder is transferred.

PATENT LITERATURE

Patent Literature 1: JP-A-11-354914

BRIEF SUMMARY

Technical Problem

However, Patent Literature 1 does not describe the number of times the nozzle is immersed in the cream solder and the number of times the cream solder is transferred for one immersion. When the first step and the second step are repeated each time the cream solder is transferred to one connecting portion of the board, a required time may increase.

In view of such a circumstance, the present specification discloses a coating device and a component mounting machine capable of reducing a time required to apply a coating agent to a board by dipping a pin member in the coating agent.

Solution to Problem

The present specification discloses a coating device including a container, a driving device, and a control section. The container accommodates a liquid coating agent to be applied to multiple mounting portions of a board on which a component is to be mounted. The driving device horizontally moves and lifts and lowers a pin member between the container and the positioned board. The control section drives and controls the driving device to dip the pin member in the coating agent to apply the coating agent to each of the multiple mounting portions using the coating agent held by a distal end portion of the pin member.

The present specification also discloses a component mounting machine including the coating device, and a mounting head configured to pick up the component and mount the picked-up component on the board. The mounting head may be used as the driving device.

Advantageous Effects

With the above-described coating device, the control section drives and controls the driving device to dip the pin member in the coating agent to apply the coating agent to each of the multiple mounting portions using the coating agent held by the distal end portion of the pin member. Therefore, the coating device can reduce a time required to dip the pin member in the coating agent and apply the coating agent to the board as compared with a case where the coating agent is applied to one mounting portion using the coating agent held by the distal end portion of the pin member. The above description of the coating device can be similarly applied to the component mounting machine including the coating device.

BRIEF DESCRIPTION OF DRAWINGS

FIG. 5B is a side view illustrating an example of a coating agent held by a distal end portion of the pin member by a dip.

FIG. 5C is a side view illustrating an example of the coating agent held by the distal end portion of the pin member when the pin member is further dipped from the state of FIG. 5B.

FIG. 6 is a schematic diagram illustrating an example of an input screen displayed on a display device.

FIG. 7 is a schematic diagram illustrating an example of a positional relationship between the driving device and a pedestal member recognized from an image captured by an imaging device.

DESCRIPTION OF EMBODIMENTS

Embodiment 1-1. Configuration Example of Component Mounting Machine 10

Figure 1:
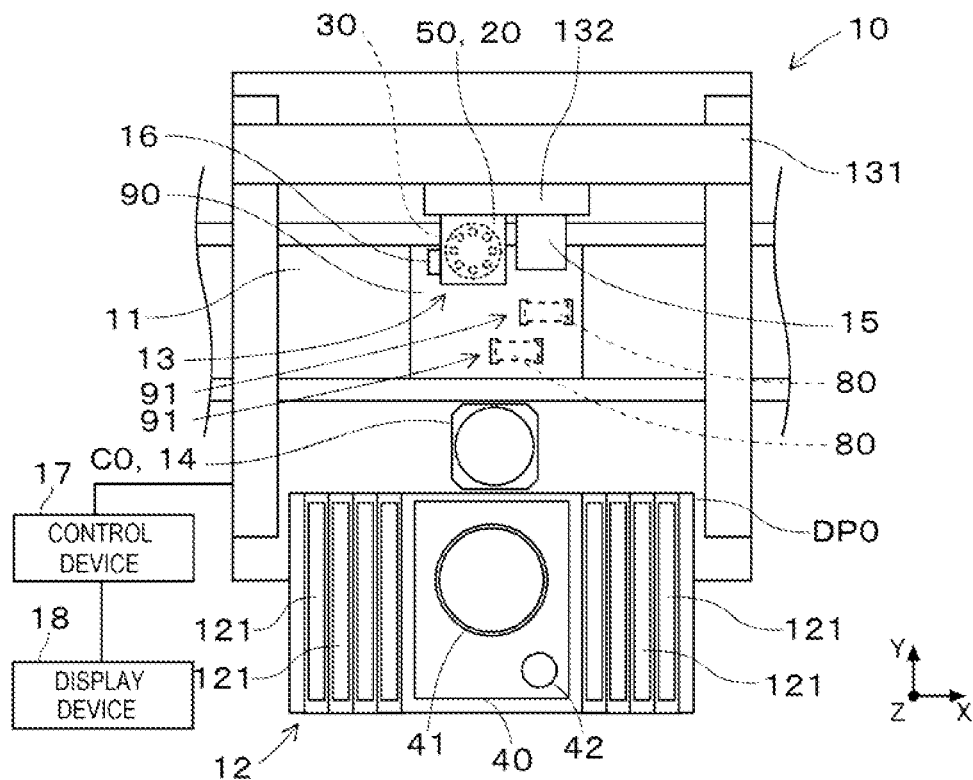
FIG. 1 is a plan view illustrating a configuration example of a component mounting machine.

Coating device 70 can be provided in a predetermined board working machine. For example, a printer, a printing inspection machine, component mounting machine 10, a reflow furnace, and an appearance inspector are included in the board working machine. Coating device 70 of the present embodiment is provided in component mounting machine 10. Component mounting machine 10 mounts multiple components 80 to board 90. As illustrated in FIG. 1, component mounting machine 10 includes board conveyance device 11, component supply device 12, component transfer device 13, part camera 14, board camera 15, side camera 16, control device 17, and display device 18.

For example, board conveyance device 11 includes a belt conveyor or the like, and conveys board 90 in a conveyance direction (X-axis direction). Board 90 is a circuit board on which an electronic circuit, an electrical circuit, a magnetic circuit, and the like are formed. Board conveyance device 11 conveys board 90 into component mounting machine 10, and positions and clamps board 90 at a predetermined position in component mounting machine 10. After a mounting process of multiple components 80 by component mounting machine 10 is completed, board conveyance device 11 unclamps board 90 and conveys out board 90 to the outside of component mounting machine 10.

Component supply device 12 supplies multiple components 80 to be mounted on board 90. Component supply device 12 includes multiple feeders 121 that are provided along the conveyance direction of board 90 (X-axis direction). Each of multiple feeders 121 pitch-feeds a carrier tape in which multiple components 80 are housed, and supplies component 80 so that component 80 is picked up at a supply position located on a distal end side of feeder 121. Moreover, component supply device 12 can supply a relatively large electronic component (lead component or the like) as compared with a chip component or the like in a state of being disposed on a tray. Multiple feeders 121 and the trays are provided so as to be detachable (exchangeable) from pallet member DP0.

Component transfer device 13 includes head driving device 131 and moving body 132. Head driving device 131 is configured to be able to move moving body 132 in an X-axis direction and a Y-axis direction (direction orthogonal to the X-axis direction in a horizontal plane) by a linear motion mechanism. Mounting head 20 is detachably (exchangeably) provided on moving body 132 by a clamp member. Mounting head 20 uses at least one holding member 30 to pick up and hold component 80 supplied by component supply device 12, and mounts component 80 on board 90 positioned by board conveyance device 11. For example, holding member 30 can use a suction nozzle, a chuck, and the like.

As part camera 14, board camera 15, and side camera 16, a well-known imaging device can be used. Part camera 14 is fixed to a base of component mounting machine 10 such that an optical axis faces upward in a vertical direction (in a Z-axis direction orthogonal to the X-axis direction and the Y-axis direction). Part camera 14 can capture an image of component 80 held by holding member 30 from below. Board camera 15 is provided on moving body 132 of component transfer device 13 such that an optical axis faces downward in the vertical direction (Z-axis direction). Board camera 15 can capture an image of board 90 from above.

Side camera 16 is provided on mounting head 20 such that an optical axis is oriented in the horizontal direction. Side camera 16 can capture an image of component 80 or the like held by holding member 30 from the side (horizontal direction). Part camera 14, board camera 15, and side camera 16 capture an image based on a control signal sent out from control device 17. Image data of images captured by part camera 14, board camera 15, and side camera 16 are transmitted to control device 17.

Control device 17 includes well-known computing device and storage device, and a control circuit is configured therein. Information, image data, and the like outputted from various sensors provided in component mounting machine 10 are inputted to control device 17. Control device 17 sends out a control signal to each device based on a control program, predetermined mounting conditions set in advance, and the like.

For example, control device 17 causes board camera 15 to capture an image of board 90 positioned by board conveyance device 11. Control device 17 performs image processing on an image captured by board camera 15 to recognize a positioning state of board 90. In addition, control device 17 causes holding member 30 to pick up and hold component 80 supplied by component supply device 12 and causes part camera 14 and side camera 16 to capture the image of component 80 held by holding member 30. Control device 17 performs image processing on the image captured by part camera 14 and side camera 16 to recognize a holding posture of component 80.

Control device 17 moves holding member 30 toward an upper side of a mounting planned position set in advance by a control program or the like. In addition, control device 17 corrects the mounting planned position based on the positioning state of board 90, the holding posture of component 80, and the like, and sets a mounting position at which component 80 is actually mounted. The mounting planned position and the mounting position include a rotation angle in addition to the position (X-axis coordinate and Y-axis coordinate).

Control device 17 corrects a target position (X-axis coordinate and Y-axis coordinate) and a rotation angle of holding member 30 in accordance with the mounting position. Control device 17 lowers holding member 30 at the corrected rotation angle at the corrected target position, and mounts component 80 on board 90. Control device 17 executes a mounting process for mounting multiple components 80 on board 90 by repeating the pick-and-place cycle described above.

As display device 18, a well-known display device can be used. Display device 18 can display setting information, work information, production information, and the like of component mounting machine 10. Display device 18 is configured by a touch panel, and also functions as an input device for receiving various operations by an operator.

1-2. Configuration Example of Coating Device 70

Figure 2:
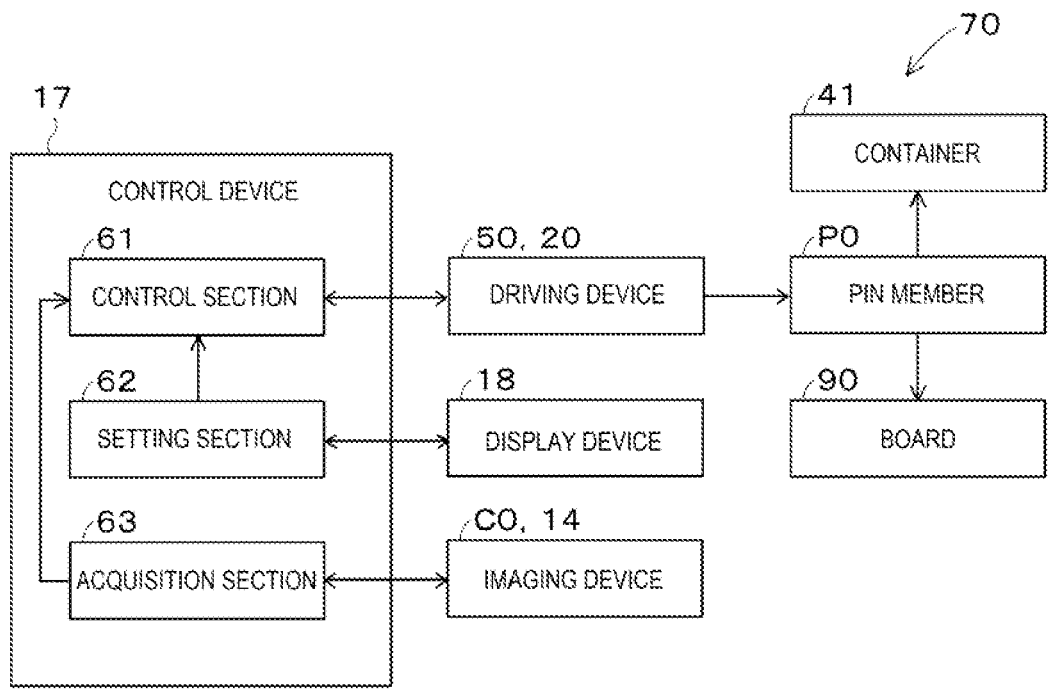
FIG. 2 is a block diagram illustrating an example of a control block of a coating device.

Coating device 70 of the present embodiment is provided in component mounting machine 10. Coating device 70 includes container 41, driving device 50, and control section 61. Coating device 70 may also include setting section 62. Coating device 70 may also include acquisition section 63. As illustrated in FIG. 2, coating device 70 of the present embodiment includes container 41, driving device 50, control section 61, setting section 62, and acquisition section 63.

Figure 3:
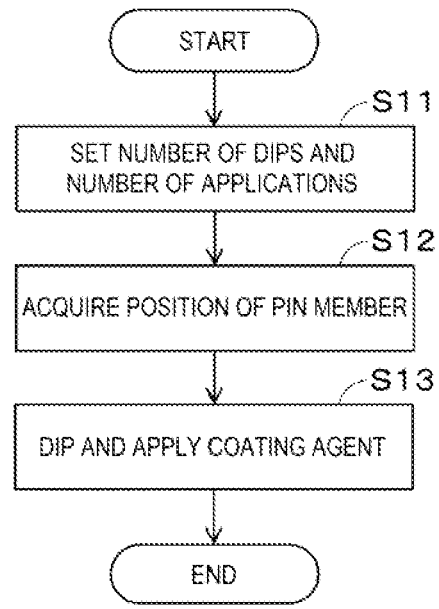
FIG. 3 is a flowchart illustrating an example of a control procedure by the coating device.

Coating device 70 of the present embodiment executes control according to a flowchart illustrated in FIG. 3. Control section 61 performs processing illustrated in Step S13. Setting section 62 performs processing illustrated in Step S11. Acquisition section 63 performs processing illustrated in Step S12.

1-2-1. Container 41

Container 41 accommodates liquid coating agent L0 to be applied to multiple mounting portions 91 of board 90 on which component 80 is mounted. Mounting portion 91 is a portion electrically connected to an electrode of component 80, and is also referred to as a pad. Coating agent L0 may be a liquid member to be applied to mounting portion 91, but is not limited thereto. For example, a bonding agent and an adhesive such as a liquid solder, a flux, and a silver paste are included in coating agent L0.

Figure 4:
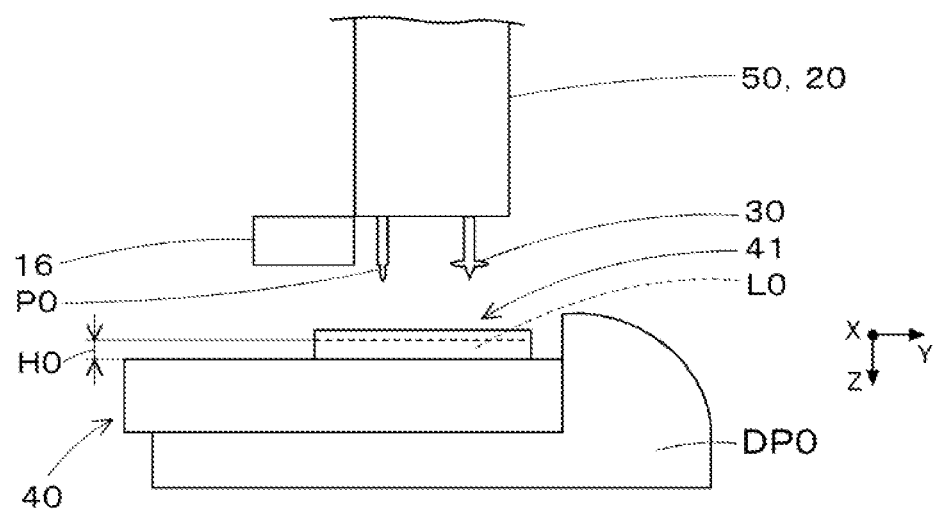
FIG. 4 is a side view illustrating an example of a positional relationship among a container, a driving device, and a pin member.

As illustrated in FIGS. 1 and 4, container 41 of the present embodiment is formed in a bottomed cylindrical shape, and container 41 is provided in dip unit 40. Dip unit 40 periodically rotates container 41 so that coating agent L0 in container 41 does not locally decrease. In addition, dip unit 40 detects a remaining amount of coating agent L0 while container 41 rotates. When the remaining amount of coating agent L0 is equal to or less than a predetermined amount, dip unit 40 replenishes coating agent L0 from storage tank 42 in which coating agent L0 is stored to container 41.

Dip unit 40 is provided to be detachable (exchangeable) from pallet member DP0. As illustrated in FIG. 1, pallet member DP0 may be provided with multiple feeders 121 and dip unit 40 simultaneously. Pallet member DP0 may be provided with a tray and dip unit 40 simultaneously. As described above, multiple feeders 121 and the tray are included in component supply device 12. As described above, container 41 (in the present embodiment, dip unit 40 including container 41) is provided exchangeably with component supply device 12 that supplies component 80. Therefore, the configuration of component mounting machine 10 can be simplified in comparison with a case where an installation space of container 41 is separately provided. In addition, the maintenance of container 41 is facilitated.

1-2-2. Driving Device 50

Driving device 50 horizontally moves and lifts and lowers pin member P0 between container 41 and positioned board 90. Driving device 50 may take various forms as long as it can only horizontally move and lift and lower pin member P0. For example, driving device 50 can move pin member P0 in the horizontal direction (X-axis direction and Y-axis direction) by a well-known linear motion mechanism. In addition, driving device 50 can lift and lower pin member P0 in the vertical direction (Z-axis direction) by a well-known lifting/lowering mechanism.

As illustrated in FIGS. 1 and 2, component mounting machine 10 according to the present embodiment includes coating device 70 and mounting head 20. As described above, mounting head 20 picks up component 80 and mounts picked-up component 80 on board 90. In the present embodiment, mounting head 20 is used as driving device 50. Therefore, the configuration of component mounting machine 10 can be simplified in comparison with a case where a driving device for moving and lifting and lowering pin member P0 is separately provided.

In mounting head 20 used as driving device 50, at least one holding member 30 is exchanged with pin member P0. Pin member P0 provided in mounting head 20 is moved in the horizontal direction (X-axis direction and Y-axis direction) by mounting head 20 in the same manner as holding member 30, and is lifted and lowered in the vertical direction (Z-axis direction). As described above, board 90 is positioned by board conveyance device 11. Pin member P0 provided in mounting head 20 is moved in the horizontal direction (X-axis direction and Y-axis direction) and lifted and lowered between container 41 and positioned board 90.

1-2-3. Control Section 61

Control section 61 applies coating agent L0 to each of multiple mounting portions 91 using coating agent L0 held by distal end portion P1 of pin member P0 by driving and controlling driving device 50 to dip pin member P0 in coating agent L0 (Step S13 illustrated in FIG. 3).

Figure 5A:
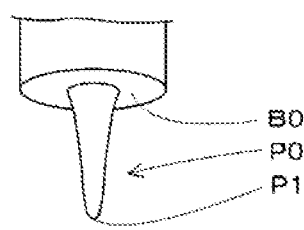
FIG. 5A is a side view illustrating an example of the pin member.

The shape of pin member P0 is not limited as long as pin member P0 can hold coating agent L0 at distal end portion P1 by dipping. As illustrated in FIG. 5A, distal end portion P1 of pin member P0 may be hemispherical. In addition, pin member P0 may have a columnar shape or a quadrangular prism shape. In addition, distal end portion P1 of pin member P0 may be provided with unevenness in order to facilitate holding of coating agent L0.

As illustrated in FIG. 2, control device 17 includes control section 61 when viewed as a control block. In the present embodiment, control section 61 drives and controls mounting head 20 used as driving device 50. Specifically, control section 61 drives and controls driving device 50 (mounting head 20) to move pin member P0 to an area above container 41. Control section 61 drives and controls driving device 50 (mounting head 20) to lift and lower pin member P0. As a result, coating agent L0 is dipped in distal end portion P1 of pin member P0.

Coating agent L0 is viscous, and dipped coating agent L0 is held by distal end portion P1 of pin member P0 by a surface tension. Next, control section 61 drives and controls driving device 50 (mounting head 20) to move pin member P0 to an area above mounting portion 91 of positioned board 90. Control section 61 drives and controls driving device 50 (mounting head 20) to lift and lower pin member P0. As a result, coating agent L0 is applied to mounting portion 91. Control section 61 can apply coating agent L0 to multiple mounting portions 91 by repeating the above-described control.

However, when control section 61 repeats the above-described control every time coating agent L0 is applied to one mounting portion 91, there is a possibility that a time required to apply coating agent L0 to board 90 increases. Therefore, in the present embodiment, control section 61 applies coating agent L0 to each of multiple mounting portions 91 to using coating agent L0 held by distal end portion P1 of pin member P0. As a result, coating device 70 can reduce the time required to dip pin member P0 in coating agent L0 and apply coating agent L0 to board 90 as compared with a case where coating agent L0 held by distal end portion P1 of pin member P0 is used to apply coating agent L0 to one mounting portion 91.

As illustrated in FIGS. 5A to 5C, as the number of dips for dipping coating agent L0 in one pin member P0 increases, an amount of coating agent L0 held by distal end portion P1 of pin member P0 increases. In addition, a unit application amount, which is an application amount necessary when coating agent L0 is applied to one of multiple mounting portions 91, differs depending on a type of component 80. Accordingly, even when the amount of coating agent L0 held by distal end portion P1 of pin member P0 is the same, the number of mounting portions 91 (the number of applications of coating agent L0 that can be applied) to which coating agent L0 can be applied changes.

Therefore, control section 61 may set the number of times coating agent L0 is dipped according to the unit application amount. Specifically, when the unit application amount is equal to or more than a predetermined amount, control section 61 dips one pin member P0 in coating agent L0 multiple times. When the unit application amount is less than the predetermined amount, control section 61 dips one pin member P0 in coating agent L0 once. The predetermined amount is a threshold value of a unit application amount at which coating agent L0 needs to be dipped twice or more. The unit application amount, the predetermined amount, and the number of times the coating agent L0 is dipped can be derived in advance by simulation, verification with an actual machine, or the like.

When coating agent L0 is dipped multiple times at the same position in container 41, it may be difficult to hold a desired amount of coating agent L0 at distal end portion P1 of pin member P0. Therefore, control section 61 may change the position at which pin member P0 is lifted and lowered in container 41 by moving pin member P0 in the horizontal direction (X-axis direction and Y-axis direction) during multiple dips. Control section 61 can change the position at which pin member P0 is lifted and lowered every dip. In addition, control section 61 can change the position at which pin member P0 is lifted and lowered every predetermined number of dips.

1-2-4. Setting Section 62

A relationship between the number of dips of dipping one pin member P0 in coating agent L0 and the number of applications of coating agent L0 that can be applied by coating agent L0 held by distal end portion P1 of pin member P0 may change depending on the types of pin member P0 and coating agent L0. Therefore, the number of dips and the number of applications may be set for each type of pin member P0 and coating agent L0.

As illustrated in FIG. 2, control device 17 includes setting section 62 when viewed as a control block. Setting section 62 sets the number of dips of dipping one pin member P0 in coating agent L0 and the number of applications of coating agent L0 that can be applied by coating agent L0 held by distal end portion P1 of pin member P0 for each type of pin member P0 and coating agent L0 (Step S1 illustrated in FIG. 3). The relationship between the number of dips and the number of applications may be derived in advance by simulation, verification with an actual machine, or the like. The derived relationship between the number of dips and the number of applications can be included in, for example, a control program of component mounting machine 10.

Setting section 62 also can cause an operator to input at least one of the number of dips or the number of applications. FIG. 6 illustrates an example of an input screen displayed on display device 18. As described above, display device 18 is configured by a touch panel, and also functions as an input device for receiving various operations by the operator.

In the example illustrated in FIG. 6, the operator can select the types of pin member P0 and coating agent L0 from a pull-down menu. FIG. 6 illustrates that type P01 is selected by the operator as the type of pin member P0, and type L01 is selected as the type of coating agent L0. Similarly, the operator can select the number of dips and the number of applications from the pull-down menu. FIG. 6 illustrates that the number of dips DT1 is selected as the number of dips by the operator and the number of applications AT5 is selected as the number of applications by the operator. The operator can also input any number of dips and any number of applications.

Setting section 62 can guide a recommended value of at least one of the number of dips or the number of applications in the input operation by the operator. The recommended value can be acquired from the relationship between the number of dips and the number of applications derived in advance by simulation, verification by an actual machine, or the like. FIG. 6 illustrates that number of times DT1 is guided as a recommended value of the number of dips, and the number of times AT2 is guided as a recommended value of the number of applications.

In a case where the operator inputs any number of dips and an any number of applications, there is a possibility that an erroneous input by the operator occurs. Therefore, setting section 62 can guide an erroneous input of the operator when at least one of the number of dips or the number of applications inputted by the operator is not included in the predetermined range. The predetermined range can be set from the relationship between the number of dips and the number of applications derived in advance by simulation, verification by an actual machine, or the like. FIG. 6 illustrates that the number of times AT5 inputted as the number of applications is inappropriate (not included in a predetermined range), and re-input of the number of applications is prompted.

1-2-5. Acquisition Section 63

As described above, control section 61 drives and controls driving device 50 (in the present embodiment, mounting head 20) to move pin member P0 to an area above mounting portion 91 of positioned board 90. Then, control section 61 drives and controls driving device 50 to lift and lower pin member P0, and thus, coating agent L0 is applied to mounting portion 91. Therefore, when position RP0 of pin member P0 in driving device 50 when driving device 50 holds pin member P0 deviates from a proper position, it may be difficult to apply coating agent L0 to mounting portion 91.

As illustrated in FIG. 2, control device 17 includes acquisition section 63 when viewed as a control block. Acquisition section 63 acquires position RP0 of pin member P0 in driving device 50 when driving device 50 holds pin member P0 (Step S12 illustrated in FIG. 3). Acquisition section 63 may have various forms as long as it can only to acquire position RP0 of pin member P0 in driving device 50.

For example, acquisition section 63 captures an image of pedestal member B0 on which at least one pin member P0 is provided in an upright manner from a side of distal end portion P1 of pin member P0 using imaging device C0. Acquisition section 63 can acquire position RP0 of pin member P0 in driving device 50 based on a positional relationship between driving device 50 and pedestal member B0 recognized from the image captured by imaging device C0.

As illustrated in FIG. 1, in the present embodiment, imaging device C0 uses part camera 14. As described above, part camera 14 is fixed to the base of component mounting machine 10 so that the optical axis faces upward in the vertical direction (Z-axis direction). When driving device 50 (mounting head 20) holding pin member P0 is located above imaging device C0 (part camera 14), imaging device C0 (part camera 14) captures the image of pedestal member B0. As a result, imaging device C0 (part camera 14) can capture the image of pedestal member B0 from the side of distal end portion P1 of pin member P0.

FIG. 7 illustrates an example of the positional relationship between driving device 50 and pedestal member B0 recognized from the image captured by imaging device C0 (part camera 14). In the example illustrated in FIG. 7, one pin member P0 is provided in an upright manner at a center of pedestal member B0. Multiple pin members P0 may be provided in an upright manner in pedestal member B0. In addition, the arrangement of multiple pin members P0 in pedestal member B0 is set, for example, in accordance with the arrangement of electrodes of component 80 to be mounted.

In FIG. 7, for convenience of explanation, a state in which pedestal member B0 is installed at center CP0 of driving device 50 and pin member P0 is located at center CP0 is assumed to be a proper position of pin member P0. In the example illustrated in FIG. 7, the center of pedestal member B0 (position RP0 of pin member P0) is deviated in a direction indicated by an arrow from center CP0 of driving device 50. In this manner, acquisition section 63 can acquire position RP0 of pin member P0 in driving device 50 based on the positional relationship between driving device 50 and pedestal member B0 recognized from the image captured by imaging device C0 (part camera 14).

Figure 8:
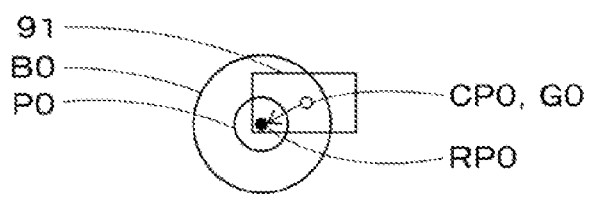
FIG. 8 is a schematic diagram illustrating an example of a positional relationship between a mounting portion and the pin member when a target position of the driving device is not corrected.

FIG. 8 illustrates an example of a positional relationship between mounting portion 91 and pin member P0 when target position G0 of driving device 50 (mounting head 20) is not corrected. Target position G0 of driving device 50 (mounting head 20) is set based on the proper position of pin member P0. Therefore, when target position G0 of driving device 50 (mounting head 20) is not corrected in the state illustrated in FIG. 7, pin member P0 may deviate from a desired position (that is, center of mounting portion 91) to make it difficult to apply coating agent L0 to mounting portion 91, as illustrated in FIG. 8.

In a mode in which coating device 70 includes acquisition section 63, control section 61 corrects target position G0 of driving device 50 when driving device 50 is moved to apply coating agent L0 in accordance with position RP0 of pin member P0 acquired by acquisition section 63. In the example illustrated in FIG. 7, a correction amount by control section 61 can be represented by a vector from the center of pedestal member B0 (position RP0 of pin member P0) toward center CP0 of driving device 50.

Figure 9:
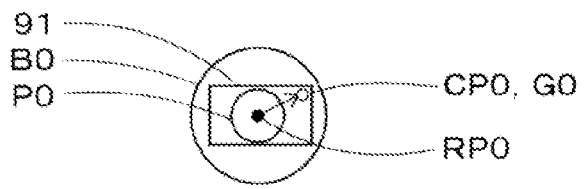
FIG. 9 is a schematic diagram illustrating an example of the positional relationship between the mounting portion and the pin member when the target position of the driving device is corrected.

FIG. 9 illustrates an example of the positional relationship between mounting portion 91 and pin member P0 when target position G0 of driving device 50 (mounting head 20) is corrected. As a result of the above correction, pin member P0 is positioned at a desired position (that is, center of mounting portion 91), and coating agent L0 is applied to mounting portion 91.

The acquisition of position RP0 of pin member P0 and the calculation of the correction amount of target position G0 of driving device 50 (mounting head 20) can be performed in a first trial production or the like after pin member P0 is held by driving device 50 (mounting head 20). The acquisition of position RP0 of pin member P0 and the calculation of the correction amount of target position G0 of driving device 50 (mounting head 20) can also be performed every time an elapsed time after pin member P0 is held by driving device 50 (mounting head 20) exceeds a predetermined timed. In addition, acquisition of position RP0 of pin member P0 and the calculation of the correction amount of target position G0 of driving device 50 (mounting head 20) can also be performed every time the number of uses of pin member P0 exceeds a predetermined number of times.

1-2-6. Other

As described above, as the number of dips for dipping pin member P0 in coating agent L0 increases, the amount of coating agent L0 held by distal end portion P1 of pin member P0 increases. Therefore, coating device 70 can estimate the amount of coating agent L0 held by distal end portion P1 of pin member P0 based on the number of dips.

However, the amount of coating agent L0 held by distal end portion P1 of pin member P0 may slightly increase or decrease depending on film thickness H0 (depth) of coating agent L0 accommodated in container 41 illustrated in FIG. 4. Specifically, when the number of dips is the same, as film thickness H0 of coating agent L0 increases, the amount of coating agent L0 held by distal end portion P1 of pin member P0 increases.

Therefore, coating device 70 may acquire the amount of coating agent L0 held by distal end portion P1 of pin member P0 after pin member P0 is dipped in coating agent L0 a predetermined number of times. For example, coating device 70 can capture the image of distal end portion P1 of pin member P0 from the side using side camera 16 illustrated in FIGS. 1 and 4, and acquire the amount of coating agent L0 held by distal end portion P1 of pin member P0 from the image captured by side camera 16.

In the present embodiment, coating device 70 is provided in component mounting machine 10. However, coating device 70 may be provided in various board working machines. For example, coating device 70 may be provided in a printer.

2. Example of Advantage of Embodiment

With coating device 70, control section 61 applies coating agent L0 to each of multiple mounting portions 91 using coating agent L0 held by distal end portion P1 of pin member P0 by driving and controlling driving device 50 to dip pin member P0 in coating agent L0. Therefore, coating device 70 can reduce the time required to dip pin member P0 in coating agent L0 and apply coating agent L0 to board 90 as compared with the case where coating agent L0 held by distal end portion P1 of pin member P0 is used to apply coating agent L0 to one mounting portion 91. What has been described above with respect to coating device 70 can be said to be the same for component mounting machine 10 including coating device 70.

REFERENCE SIGNS LIST

10: component mounting machine, 12: component supply device, 20: mounting head, 41: container, 50: driving device, 61: control section, 62: setting section, 63: acquisition section, 70: coating device, 80: component, 90: board, 91: mounting portion, P0: pin member, P1: distal end portion, B0: pedestal member, L0: coating agent, RP0: position, G0: target position, C0: imaging device.

The invention claimed is:

1. A component mounting machine comprising:
a coating device comprising:
a container configured to accommodate a liquid coating agent to be applied to multiple mounting portions of a board on which a component is to be mounted;
a driving device configured to horizontally move and lift and lower a pin member between the container and the positioned board;
a camera that captures from below an image of the pin member and a pedestal member on which the pin member is provided to acquire a position of the pin member in the driving device based on a positional relationship between the driving device and the pedestal member recognized from the image; and
a control section configured to
drive and control the driving device to dip the pin member in the coating agent to apply the coating agent to each of the multiple mounting portions using the coating agent held by a distal end portion of the pin member, and
correct a target position of the driving device when the driving device is moved to apply the coating agent in accordance with the position of the pin member acquired from the image;
a mounting head configured to pick up the component and mount the component on the board, the mounting head being used as the driving device; and
a component supply device configured to supply the component,
wherein the container and the component supply device are mounted to a pallet member of the component mounting machine in positions that are exchangeable with each other.

2. The component mounting machine according to claim 1,
wherein the control section dips one pin member in the coating agent multiple times when a unit application amount is a predetermined amount or more, the unit application amount being an application amount required when the coating agent is applied to one of the multiple mounting portions.

3. The component mounting machine according to claim 1,
wherein the control section dips one pin member in the coating agent once when a unit application amount is less than a predetermined amount, the unit application amount being an application amount required when the coating agent is applied to one of the multiple mounting portions.

4. The component mounting machine according to claim 1, further comprising:
a setting section configured to set a number of dips for dipping one pin member in the coating agent and the number of applications of the coating agent applied by the coating agent held by the distal end portion of the pin member for each type of the pin member and the coating agent.

5. The component mounting machine according to claim 4,
wherein the setting section causes an operator to input at least one of the number of dips or the number of applications.

6. The component mounting machine according to claim 5,
wherein the setting section guides a recommended value of at least one of the number of dips or the number of applications in an input operation by the operator.

7. The component mounting machine according to claim 5,
wherein the setting section guides an erroneous input of the operator when at least one of the number of dips or the number of applications inputted by the operator is not included in a predetermined range.

8. A component mounting machine comprising:
a coating device comprising:
  a container configured to accommodate a liquid coating agent to be applied to multiple mounting portions of a board on which a component is to be mounted;
  a driving device configured to horizontally move and lift and lower a pin member between the container and the positioned board;
  a camera that captures from below an image of the pin member and a pedestal member on which the pin member is provided to acquire a position of the pin member in the driving device based on a positional relationship between the driving device and the pedestal member recognized from the image; and
  a control section configured to
    drive and control the driving device to dip the pin member in the coating agent to apply the coating agent to each of the multiple mounting portions using the coating agent held by a distal end portion of the pin member, and
    correct a target position of the driving device when the driving device is moved to apply the coating agent in accordance with the position of the pin member acquired from the image; and
a mounting head configured to pick up the component and mount the component on the board, the mounting head being used as the driving device,
wherein the camera is fixed to a base of the component mounting machine along a movement path of the mounting head between the container and board.

9. The component mounting machine according to claim 8,
wherein the control section dips one pin member in the coating agent multiple times when a unit application amount is a predetermined amount or more, the unit application amount being an application amount required when the coating agent is applied to one of the multiple mounting portions.

10. The component mounting machine according to claim 8,
wherein the control section dips one pin member in the coating agent once when a unit application amount is less than a predetermined amount, the unit application amount being an application amount required when the coating agent is applied to one of the multiple mounting portions.

11. The component mounting machine according to claim 8, further comprising:
a setting section configured to set a number of dips for dipping one pin member in the coating agent and the number of applications of the coating agent applied by the coating agent held by the distal end portion of the pin member for each type of the pin member and the coating agent.

12. The component mounting machine according to claim 11,
wherein the setting section causes an operator to input at least one of the number of dips or the number of applications.

13. The component mounting machine according to claim 12,
wherein the setting section guides a recommended value of at least one of the number of dips or the number of applications in an input operation by the operator.

14. The component mounting machine according to claim 12,
wherein the setting section guides an erroneous input of the operator when at least one of the number of dips or the number of applications inputted by the operator is not included in a predetermined range.

* * * * *